United States Patent [19]

White, Jr. et al.

[11] 4,081,701
[45] Mar. 28, 1978

[54] HIGH SPEED SENSE AMPLIFIER FOR MOS RANDOM ACCESS MEMORY

[75] Inventors: Lionel S. White, Jr.; Hugh P. McAdams; Donald J. Redwine, all of Houston, Tex.

[73] Assignee: Texas Instruments Incorporated, Dallas, Tex.

[21] Appl. No.: 691,735

[22] Filed: Jun. 1, 1976

[51] Int. Cl.$^2$ .......................... H03K 5/20; H03K 5/18; H03K 3/286; G11C 11/40

[52] U.S. Cl. .................................... 307/355; 307/238; 307/279; 307/356; 307/DIG. 3; 365/203; 365/205

[58] Field of Search ............... 307/238, 279, 355, 356, 307/362, 363, DIG. 3, DIG. 4, DIG. 5; 340/173 R, 173 CA

[56] References Cited

U.S. PATENT DOCUMENTS

| | | | |
|---|---|---|---|
| 3,771,147 | 11/1973 | Boll et al. | 340/173 R |
| 3,806,898 | 4/1974 | Askin | 307/205 X |
| 3,949,381 | 4/1976 | Dennard et al. | 307/DIG. 3 X |
| 3,992,704 | 11/1976 | Kantz | 307/238 X |
| 3,993,917 | 11/1976 | Kalter | 307/DIG. 3 X |
| 4,010,453 | 3/1977 | Lewis | 307/279 X |

OTHER PUBLICATIONS

Chu et al., "Low-Power, High-Speed Sense Latch;" *IBM Tech. Discl. Bull.;* vol. 17, No. 9, pp. 2582-2583; 2/1975.

Bishop et al., "High-Sensitivity, High-Speed FET Sense Latch," *IBM Tech. Discl. Bull.;* vol. 18, No. 4, pp. 1021-1022, 9/1975.

Barsuhn et al., "Semiconductor Storage Circuit Utilizing Two Device Memory Cells," *IBM Tech. Discl. Bull.;* vol. 18, No. 3, pp. 786-787; 8/1975.

Lewis, "Memory Sense Amplifier," *IBM Tech. Discl. Bull.;* vol. 18, No. 11, pp. 3601-3602; 4/1976.

*Primary Examiner*—Larry N. Anagnos
*Attorney, Agent, or Firm*—James T. Comfort; John G. Graham

[57] ABSTRACT

A random access memory device of the MOS integrated circuit type employs an array of rows and columns of one-transistor storage cells with bistable sense amplifier circuits at the center of each column. The load transistors in each bistable circuit have clock voltages applied to their gates after an initial sensing period, so the initial sensing is done without loads for the bistable circuit. After this initial period, the load transistors are turned on by boosting capacitors. Then, fixed biased transistors shunting the gates of the load device to the digit lines function to turn off the load device on the zero logic level side.

11 Claims, 10 Drawing Figures

HIGH SPEED SENSE AMPLIFIER FOR MOS RANDOM ACCESS MEMORY

BACKGROUND OF THE INVENTION

This invention relates to semiconductor memory devices, and more particularly to an improved sense amplifier for an N-channel MOS memory device of the type employing one-transistor memory cells.

MOS random access memory (RAM) devices are widely used in the manufacture of digital equipment, particularly minicomputers. The capabilities and cost advantages of these devices have increased steadily over the past few years. The cost per bit of storage using MOS RAMs goes down as the number of bits or memory cells per package goes up. Successively larger RAM's have been standards in the industry, such as 256 bit, 512 bit, 1024 bit, and how 4096 bit. A RAM containing 4096 bits, for example, is shown in U.S. Pat. No. 3,940,747 issued Feb. 24, 1976 to Kuo and Kitagawa, assigned to Texas Instruments. At the present time, manufacturers of semiconductor devices are attempting to produce 16,384 bit or "16K" RAM's; see articles in *Electronics*, Feb. 19, 1976, pp. 116–121, and May 13, 1976, pp. 81–86.

As the number of bits in a semiconductor chip is increased, the cell size decreases, and the magnitude of the storage capacitor in each cell of necessity decreases. Also, the number of cells on a digit line in the array of cells increases, so the capacitance of this line increases. These factors reduce the magnitude of the data signal which exists on a digit line. A full logic level, i.e., the difference between a "1" and "0," in one of these devices may be perhaps 10 or 12 volts; however, the difference in voltage between a "1" and a "0" for the data coupled to a digit line in the memory array from the selected one-transistor cell may be only one tenth volt or less. Various circuits for sensing these low-level signals have been proposed. For example, sense amplifiers are shown in U.S. Pat. No. 3,940,747 and the *Electronics* articles mentioned above, and in U.S. Pat. No. 3,838,404 to Heeren, as well as in *Electronics*, Sept. 13, 1973, Vol. 46, No. 19, pp. 116–121, and *IEEE Journal of Solid State Circuits*, Oct. 1972, p. 336, by Stein et al.

When applied to memory devices requiring high packing density, high speed, and low power dissipation, such as in the 16K RAM, the sense amplifiers previously proposed have shortcomings. Some exhibit high power dissipation and overly long charging times for the digit lines. Others require high instantaneous current and critical clock timing.

It is therefore a principal object of this invention to provide an improved sense amplifier for an MOS RAM, and in particular a sense amplifier which is of low power dissipation and high speed operation, as well as high sensitivity.

BRIEF SUMMARY OF THE INVENTION

In accordance with the invention, an MOS RAM using one-transistor cells employs a sense amplifier of the type having a pair of cross-coupled driver transistors connected as a bistable circuit, at the center of each column line in the memory array. Load transistors for the pair of driver transistors are clocked on only during a part of the operating cycle; prior to this time the cells have been addressed. The driver transistors are connected to ground through two different paths provided by two transistors which are clocked on at different times. During an initial sensing period, the current through the driver transistors is kept low, then allowed to be higher during a latter time so that an output of full logic level is produced. The load transistors are clocked on after the initial sensing period, i.e., during said latter time, by boosting capacitors. The gates of the load transistors are connected to the digit lines by shunting transistors which have a selected voltage level on their gates; their function to turn off the load transistor on the zero-going side of the sense amplifier.

BRIEF DESCRIPTION OF THE DRAWINGS

The novel features believed characteristic of the invention are set forth in the appended claims, the invention itself, however, as well as other features and advantages thereof, will best be understood by reference to the following detailed description of a particular embodiment, read in conjunction with the accompanying drawings, wherein:

DETAILED DESCRIPTION OF SPECIFIC EMBODIMENT

Figure 1:
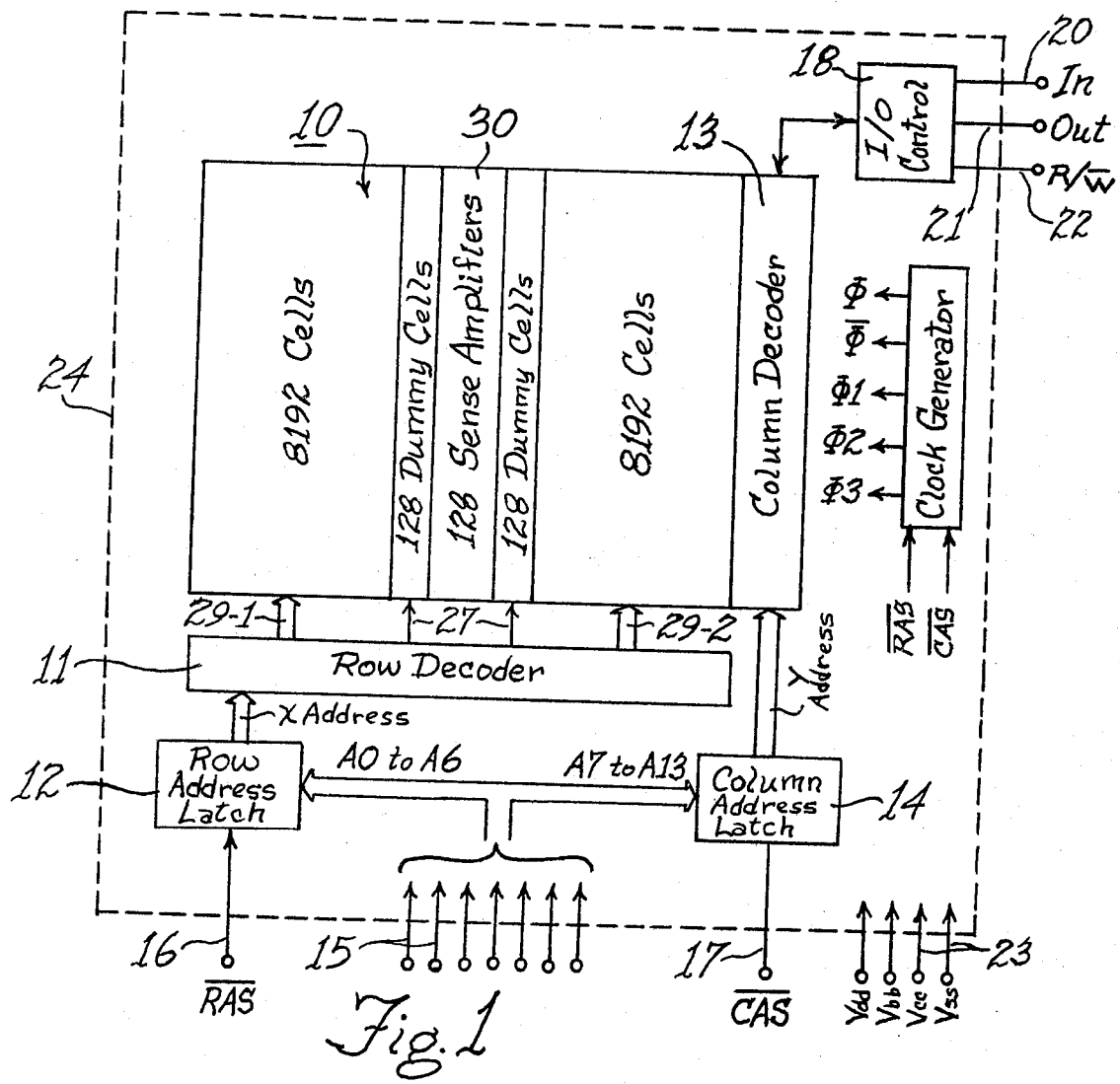
FIG. 1 is a block diagram of a semiconductor memory device which may utilize the invention.
Figure 2:
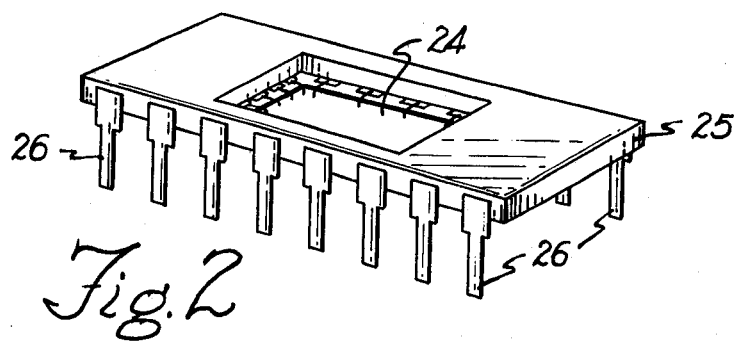
FIG. 2 is a pictorial view of the device of FIG. 1 in a package.

Referring to FIG. 1, an MOS memory device which may use the invention is illustrated. While this device may be of various sizes, the invention was intended for use in a very high density memory containing 16,384 cells on one silicon chip of about one-twentieth square inch, made by an N-channel silicon-gate self-aligned MOS process which is described in U.S. patent application Ser. No. 648,594, filed Jan. 12, 1976 by C-K Kuo for MOS Memory Cell Using Double Level Polysilicon, assigned to Texas Instruments. The device consists of an array 10 of 16,384 memory cells which is generally divided into 128 rows and 128 columns; each cell is a so-called one-transistor cell of the type shown in said application Ser. No. 648,594. A row decoder 11 selects one of the 128 row lines as determined by a row or X address contained in a seven-bit row address buffer or latch 12, and a column decoder 13 selects one of the 128 column lines as determined by a column or Y address contained in a seven-bit column address buffer 14. These addresses are applied to the chip by seven address lines 15, on a time-share basis. An $\overline{RAS}$ or row address strobe input 16 (see in FIG. 4g) when at zero volts enables the row address buffer 12 to accept a row address, which includes address bits A0 to A6. In like manner a $\overline{CAS}$ or column address strobe input 17 (see in FIG. 4h) when at zero volts enables the column address buffer to accept a column address (bits A7 to A13) from the lines 15. The row and column addresses must be valid on the pins 15 during the time periods shown in FIG. 4f. Fourteen address bits are needed to uniquely define one bit of 16,384 cells ($2^{14} = 16,384$). Input/output control circuitry 18 is connected to the array 10 via column decode 13, and functions to apply data to the column lines from a data input pin 20, or to detect data on the column lines and apply it to a data output pin 21, under control of a read/write R/W input 22 as well as under control of various internally generated clock and logic voltages. The device requires several supply or input voltages on pins 23; these include Vbb, Vcc and Vdd supply voltages as well as ground or Vss. Of course, some circuits are designed to operate on one or two supply voltages rather than three. Typically, Vdd = 12v., Vbb = −5v. and Vcc = +5v. As seen in FIG. 2, the device of FIG. 1 is in the form of a silicon chip 24 mounted in a package 25 which has 16 pins 26 corresponding to the 16 input and output lines mentioned above. Thin gold wires connect bonding pads on the silicon chip 24 to internal terminals for the pins 26. A lid, not shown, would seal the device. The package 25 is about ¾ inch in length and 0.3 inch in width so a large number of these packages can be mounted on a standard sized circuit board. For example, a minicomputer may have an entire 32K or 64K word (16 bits/word) memory on one small circuit board.

Figure 4:
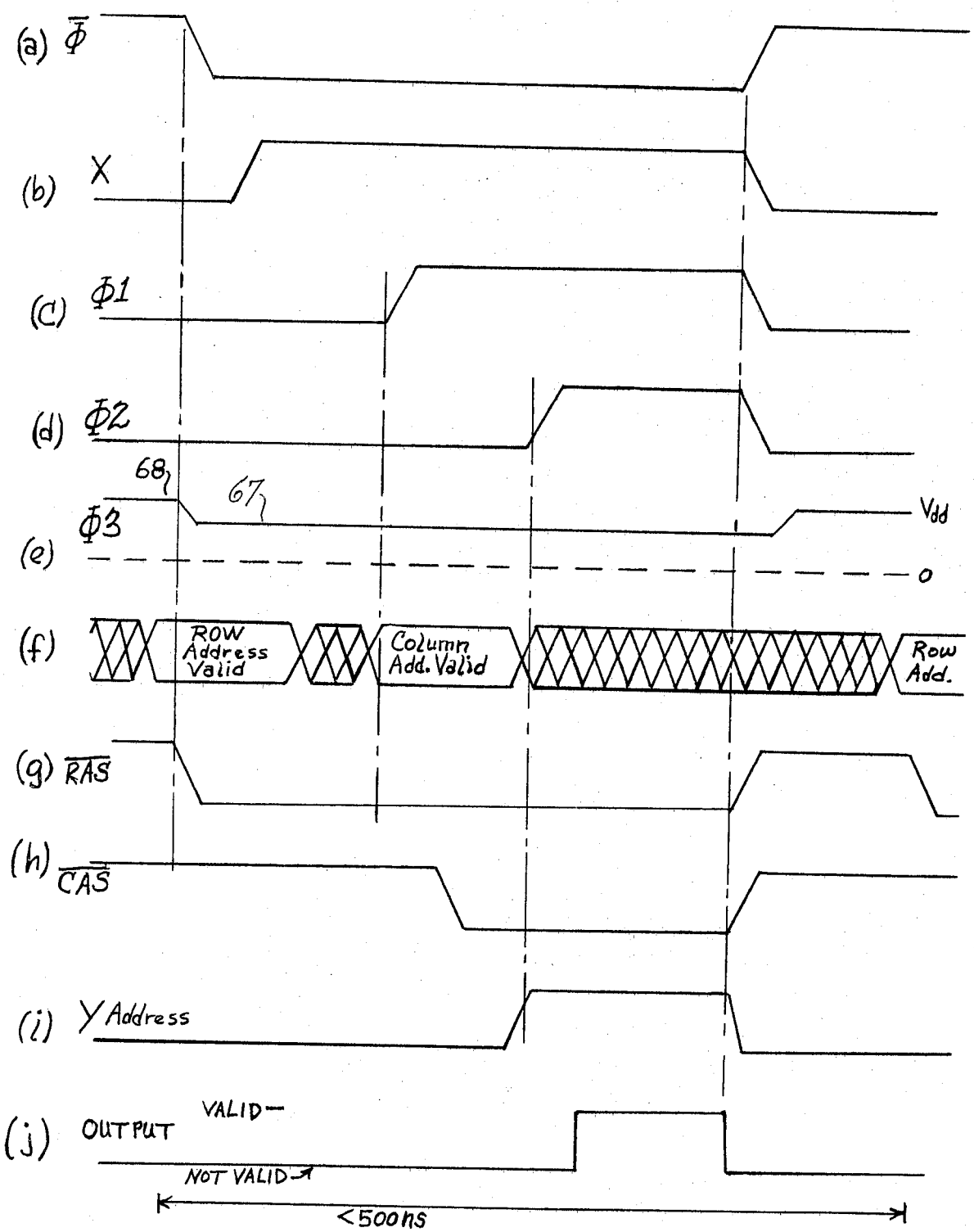
FIG. 4a–4f are graphic representations of voltages appearing at various points in the system of the invention, plotted as a function of time.

The decoder 11, of conventional design, functions to select one out of the 64 row lines 29-1 on the left side or one of the 64 row lines 29-2 on the right side. A row line is a metal line which extends along most of the width of the chip and drives the gates of 128 MOS transistors in the 128 memory cells associated with this row. The seven address bits A0 to A6 in row decoder 11 select one row line 29 out of 128 to go high, the remaining 127 remain low. The row address exists (referred to as X in FIGS. 4b and 5) on the selected lines 29 during the $\overline{RAS}$ time as seen in FIG. 4g. A6 selects either left or right side, i.e., permits activation of either lines 29-1 or lines 29-2. Then the six bits of A0 to A5 will select one of the 64 lines in the selected half. A6 will also determine activation of dummy cells in the unselected side via dummy cell address lines 27, during $\overline{RAS}$, as is conventional.

In accordance with the invention, the memory device of FIG. 1 contains improved sense amplifiers 30 in the center of each column line. The sense amplifiers are for the purpose of detecting the low signal created on the selected column line when a cell is addressed and converting this low signal to a full logic level.

Figure 3:
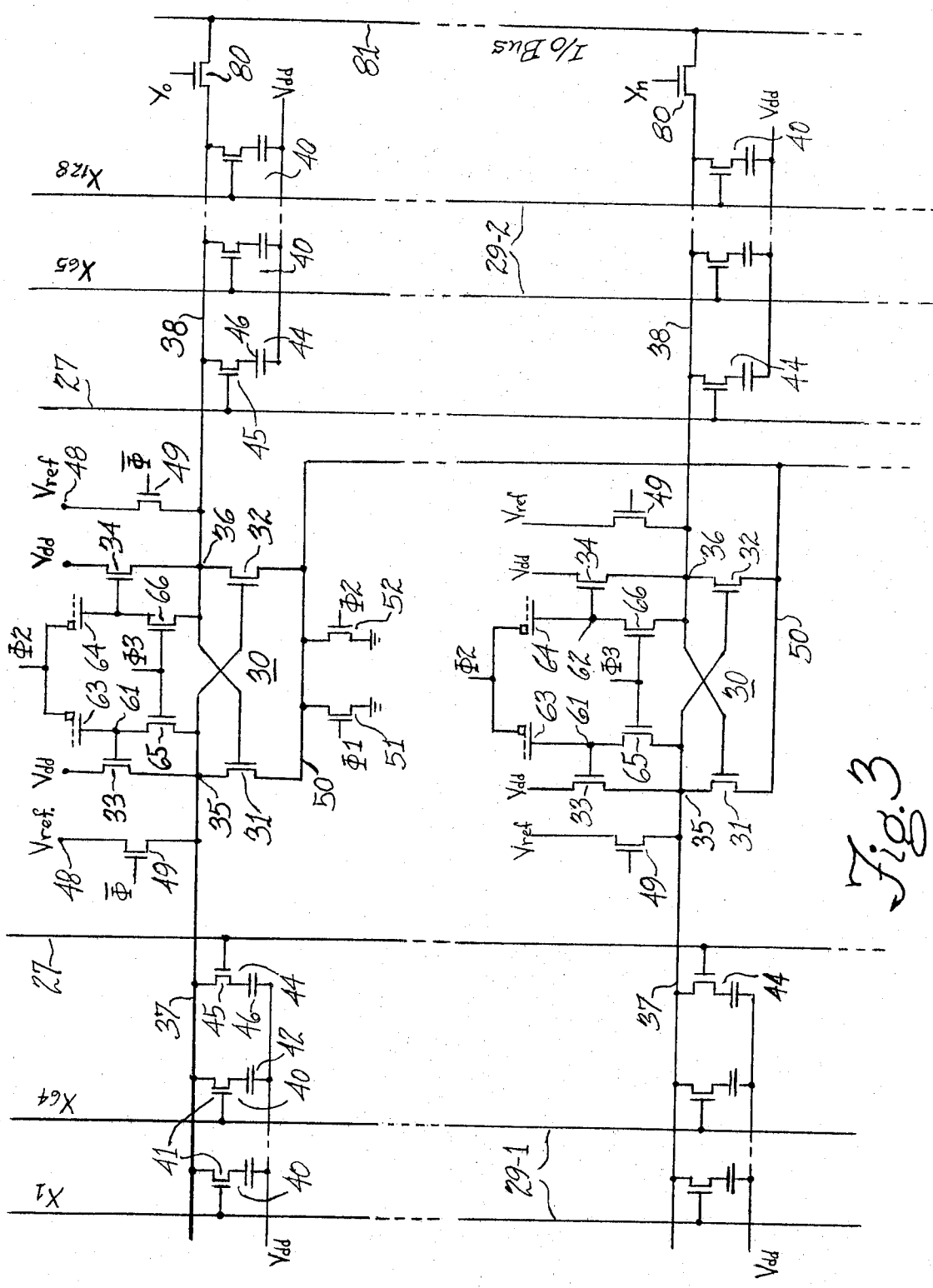
FIG. 3 is an electrical schematic diagram of an array of memory cells for the system of FIG. 1, employing the sense amplifiers of the invention.

Referring to FIG. 3, a sense amplifier 30 according to the invention is illustrated in a part of the array. The sense amplifier 30 basically consists of a flip-flop or bistable circuit having two cross-coupled driver transistors 31 and 32 along with associated load transistors 33 and 34. A pair of nodes 35 and 36 are connected to the respective halves 37 and 38 of the column line. These nodes 35 and 36 are connected to the gates of the opposite transistors 31 and 32 to provide the cross-coupled arrangement.

The line 37, half of a column line, has 64 cells 40 connected to it, and so does the line 38. Each cell consists of a transistor 41 and a capacitor 42; the gate of each transistor 41 is controlled by a row line 29-1 or 29-2 (the row line is also referred to as a word line and an X line), and each row line is connected to 128 gates for like transistors 41. In the array 10 of this embodiment, there are 64 row lines on each side of the sense amplifiers 30, and, of course, there are 128 sense amplifiers 30, so only a very small part of the array 10 is seen in FIG. 3. Each sense amplifier has two dummy cells 44, one on each side, connected to the column lines 37 and 38. The dummy cells are like the storage cells 40, and each includes a transistor 45 and a capacitor 46. Lines 27 function to turn on the transistor 45 in the row of dummy cells on the opposite side of the sense amplifier from the selected cell 40 as defined by bit A6 of the row address, at the same time the selected storage cell 40 is addressed. Each column line 37 or 38 is connected to a reference voltage line 48 through a transistor 49, with the gates of these transistors being driven by $\phi$; this functions to charge the lines 37 and 38 equally from a reference voltage level selected to be slightly below Vdd; for example, if Vdd is +12v. and Vt is about 1 volt, Vref may be about 10 or 11 volts. The load transistors 33 and 34 are connected to Vdd and are controlled by the improved circuitry of the invention as described below. The flip-flop circuit including the transistors 31 and 32 begins to function before the transistors 33 and 34 are rendered conductive, when a node 50 connected to the drains of the transistors is coupled to ground.

In accordance with the invention disclosed and claimed in copending application Ser. No. 682,687 filed May 3, 1976, by Kitagawa and McAlexander, the node 50 is grounded through separate paths including in this case two transistors 51 and 52 which are controlled by clocks $\phi 1$ and $\phi 2$. The transistors 51 and 52 are of different sizes so the amount of current drawn by these transistors from the node 50 to Vss or ground is different. Thus, the voltage on the node 50 will change depending upon which of the transistors 51 and 52 is on. Transistor 51 is the smallest and transistor 52 is about twice its size, measured in device ratio or width to length of the channel. All 128 of the sense amplifiers 30 in the array 10 share the same pair of transistors 51 and 52; a line 53 connects together the nodes 50 of all these sense amplifiers.

When a clock $\phi 1$ (seen in FIG. 4c) goes positive, a sense operation is initiated, and the flip-flop will tend to go toward a stable condition where either transistor 31 is conductive and transistor 32 is cut off, or vice versa. The direction of switching will depend upon the voltage difference between lines 37 and 38 which depends upon whether a one or zero was stored in the selected cell 40. Since one of the lines 37 or 38 will be at a slightly higher voltage than the other, one of the transistors 31 or 32 will have a slightly higher voltage on its gate than the other, and thus when $\phi 1$ goes positive one transistor will tend to conduct slightly more current than the other.

The voltage on the node 50 tends to be higher for a smaller device ratio of the transistor 51, and the sensitivity of the amplifier 30 during the initial period 58 can be shown to be directly related to the voltage on the node 50, for a given threshold voltage and digit line voltage.

The circuit of FIG. 3 as described thus far provides high speed operation because the precharged voltage on the digit line 37 or 38 (which is to stay at "1" logic level) tends to stay high during this initial sensing period, i.e., when $\phi 1$ is on but before $\phi 2$ comes high. That is, the sense amplifier of FIG. 3 provides a minimum charging time to the digit lines 37 or 38 to refresh a "1" level because the node of the sense amplifier which is to stay at the "1" level does not discharge to a low voltage during the initial sense operation.

Figure 5:
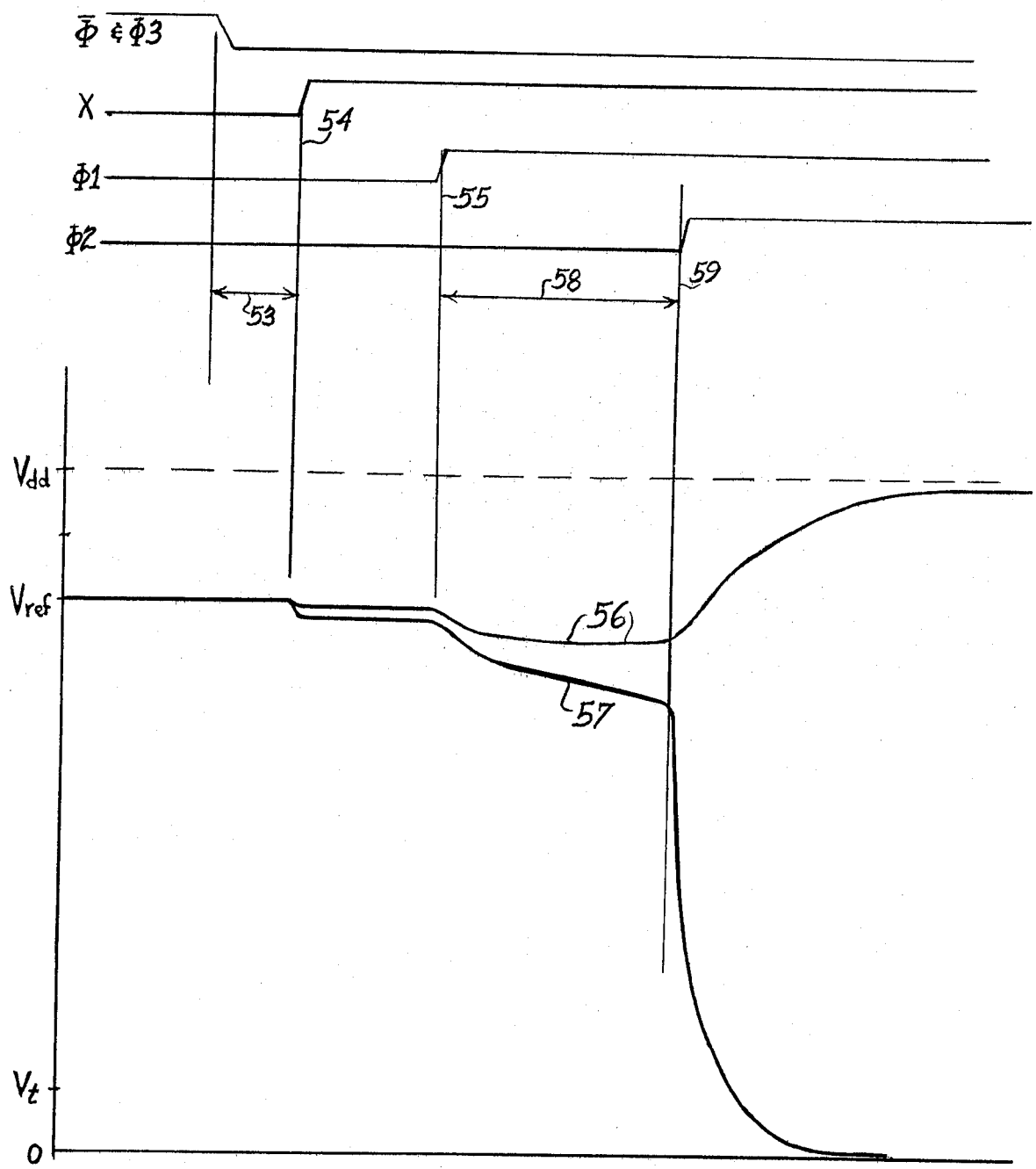
FIG. 5 is a detailed graphic representation of voltage vs. time for the digit lines in the circuit of FIG. 3.

Referring to FIG. 5, the voltage on the digit lines 37 and 38 is shown in enlarged view as a function of time as the clock $\phi 1$ comes on. During the time 53, before the address actuates one of the row lines 11-1 or 11-2 and before $\phi 1$ goes high, the voltage on the digit lines 37 and 38 is equalized at Vref or about Vdd as defined by charging from the line 48. At a time 54, one of the lines 29-1 or 29-2 goes high, and the voltages on the lines 37 and 38 separate very slightly, perhaps 50 to 100 millivolts due to one of the storage capacitors 42 being connected to one side and a dummy cell capacitor 46 (smaller than 42) being connected to the other. At time 55, $\phi1$ goes high and one of the lines 37 or 38 begins to discharge toward a "0" level during an interval 58 while the other discharges only slightly, not over about one volt, as seen by lines 56 and 57. In the time interval 58, prior to the time 59 when $\phi2$ comes on, if a "1" was stored the transistor 31 or 32 opposite the selected cell will conduct more than the one opposite the dummy cell. If a "0" is stored, the reverse is true.

In accordance with the principal feature of this invention, the sense amplifier 30 of FIG. 3 includes a particular arrangement for controlling conductance of the load transistors 33 and 34 when $\phi2$ goes high. Nodes 61 and 62 at the gates of the load transistors 33 and 34 are connected to the clock $\phi2$ source via gated capacitors 63 and 64, and are also connected to the digit lines 37 and 38 via transistors 65 and 66 which are clocked by $\phi3$ (seen in FIG. 4c). The clock $\phi3$ does not switch from V$dd$ to V$ss$, but instead varies between (V$dd$-V$t$) and an intermediate voltage, lower than V$ref$, of about 8 volts (for +12v. V$dd$). $\phi2$, seen in FIG. 4d as well as in FIG. 5, also turns on the transistor 52. The capacitors 63 and 64 act as "boosting" or bootstrap capacitors and produce a high drive voltage on the gates of the load transistors 33 and 34. This permits rapid charging of the digit line which is to be restored to the "1" level, as seen by the line 56 of FIG. 5, and this, of course, speeds the restoration of the "1" level voltage in the selected storage cell 40. The transistors 65 and 66 in conjunction with the intermediate level 67 of the $\phi3$ clock provide for discharge of the driving voltage on one of the nodes 61 or 62 at the gate of the load transistor on the zero-going side of the sense amplifier. This greatly reduces the power consumption of the sense amplifier.

During $\overline{\phi}$, seen in FIG. 4a, the lines 37 and 38 are being precharged while $\phi1$ and $\phi2$ are zero and $\phi3$ is high; at this time the nodes 61 and 62 are being precharged to about (V$dd$−2V$t$) or the maximum level 68 of $\phi3$ minus V$t$, and the nodes 35 and 36 will be charged to V$ref$. When $\overline{\phi}$ goes to zero, the digit lines 37 and 38 are isolated from V$ref$, and at the same time $\phi3$ goes to level 67, an intermediate voltage. This level 67 is selected so that (a) the charge on the boosting capacitor 63 or 64 that is connected to the one-going side of the sense amplifier is not discharged during sensing and (b) the charge on the other boosting capacitor connected to the zero-going side is discharged as the voltage on the digit line falls during sensing. As the voltage differential between the digit lines 37 and 38 is established by charge sharing of the dummy cell capacitance 46 and the storage cell capacitor 42, as the selected X line 29-1 or 29-2 goes high and the dummy cell select line 27 goes high, the operation is as mentioned above with reference to the interval 58 of FIG. 5. As $\phi1$ goes high at time 55, amplification of the voltage difference begins. Then later, at time 59, $\phi2$ goes high, which will boost the voltage on the gates of the load devices 33 and 34, and also will turn on the transistor 52 and speed the discharge of the zero-going side as seen by the line 57 of FIG. 5. When the digit line voltage on the zero-going side drops one V$t$ below the level 67 of $\phi3$, the transistor 65 or 66 will turn on and begin discharging the voltage on the boosting capacitor 63 or 64 for this side, thus turning off the load device 33 or 34.

For example, if we assume that the node 35 is the zero-going side (a selected cell on digit line 37 stores a zero as a selected cell or digit line 38 stores a one), when X goes high, the voltage at node 35 will be slightly less than the voltage on node 36, or node 36 will correspond to line 56 of FIG. 5 and node 35 to line 57. When $\phi1$ goes high, at 55, the voltage difference between nodes 35 and 36 is amplified during period 58. When node 35 drops one V$t$ below level 67 on the gate of transistor 65, the voltage on the node 61 begins discharging. When $\phi2$ goes high at 59, the amplification of the voltage difference between 56 and 57 is increased and the node 36 rapidly begins charging toward V$dd$. If the node 35 has fallen sufficiently below level 67 of $\phi3$ before $\phi2$ turns on, then the node 61 will never be boosted, and the transistor 33 will not turn on. If the node 35 has not fallen far enough when $\phi2$ goes high, then the node 61 will be boosted by $\phi2$ until the node 35 does not fall far enough to discharge the node 61. This will result in a very brief period of static operation, i.e., the load transistor 33 and the grounding transistors 51, 52 will be conduction at the same time.

A speed vs. power trade-off exists in the selection of the timing of $\phi1$ and $\phi2$. If $\phi2$ as applied to the boosting capacitors 63 and 64 is delayed slightly, compared to that applied to the transistor 52, so that the zero-going digit line voltage is sufficiently more than one V$t$ below level 67 of $\phi3$, then the load device for that digit line is never turned on and only the discharging of the stored energy of the digit line capacitance consumes power. However, delaying $\phi2$ to the capacitors 63 and 64 may cause the access time of the device to be increased. Use of no delay in $\phi2$, provides the fastest access time, but power consumption is slightly increase since the load device of the zero-going side is turned on for a short period.

As described above, $\phi3$ is a dual level signal with a high level 68 and a low level 67 of less than V$dd$ but much greater than V$ss$. The high level 68 part functions to speed up equalization of the voltage on the nodes 61 and 62. $\phi3$ may be replaced by a constant voltage at level 67 at the expense of slowing equalization.

Using a small device ratio for the transistor 51 causes the amplification for the zero-going side to be insufficient. It is for this reason that the transistor 52 is provided to produce further amplification so that the digit line 37 or 38 which is to go low will have a good zero level. Noise from other circuits appears during read or write operations, so good logic levels must be produced on the lines 37 and 38 to ensure reliable operation. For the selected Y line 38, a transfer gate 80 will be rendered conductive, and this line will be connected to a bus 81 going to an output buffer or an input buffer in the I/O control 18. These will represent added capacitance and noise. For these reasons, the high logic levels provided by the larger transistor 52 is needed.

Although the invention has been described with reference to a specific embodiment, this description is not meant to be construed in a limiting sense. Various modifications of the disclosed embodiment, as well as other embodiments of the invention, will become apparent to persons skilled in the art upon reference to the description of the invention. It is therefore contemplated that the appended claims will cover any such modifications or embodiments as fall within the true scope of the invention.

What is claimed:

1. In a memory system of the type having an array of rows and columns of memory cells and a sense amplifier positioned at the center of each column line, the sense amplifier comprising a pair of cross coupled driver transistors and a load transistor for each driver transistor, a supply voltage of a given value for the memory system, each of said transistors having a source-to-drain path and a gate, the improvement comprising a pair of switching devices each connected to discharge the gate of one of the load transistors, each of the switching devices having a source-to-drain path and a gate and a selected voltage applied to their gates which is less than said supply voltage, coupling means for applying a voltage to the gates of the load transistors sufficient to turn on the load transistors at a selected time, and means for precharging the column lines prior to said selected time.

2. Apparatus according to claim 1 wherein the sense amplifiers include means for connecting the sources of the driver transistors to reference potential, and such means are sequentially actuated during a period in an operating cycle beginning prior to said selected time and ending after said selected time.

3. Apparatus according to claim 2 wherein said means includes a pair of MOS transistors which are selectively actuated at differing times.

4. Apparatus according to claim 3 wherein the per bit ratio of width to length of the channel of one of the pair of MOS transistors is very small compared to that of the channels of the driver transistors.

5. Apparatus according to claim 4 wherein said one of the pair of MOS transistors is turned on during a given time prior to said selected time during an operating cycle.

6. Apparatus according to claim 5 wherein the coupling means comprises gated capacitors having one side connected to a clock source exhibiting a change in voltage level at said selected time during each operating cycle.

7. In a sense amplifier for a semiconductor memory of the type having a pair of cross-coupled driver transistors and a pair of load transistors connecting the driver transistors to a supply voltage, each of the driver and load transistors having a source, drain and a gate, each driver transistor having its drain connected to one of a pair of opposing digit lines which have a plurality of memory cells connected thereto, two separate control transistors each having a source-to-drain path connecting the sources of the driver transistors to a reference potential, each of the control transistors having a gate, means for supplying control voltages to the gates of the control transistors for actuating one of the control transistors at a first time in an operating cycle and activating the other of the control transistors at a selected time later than the first time in each operating cycle, the improvement comprising means for connecting the gates of the load transistors to the digit lines whereby the load transistor for the digit line which goes to logic zero is rendered non-conductive at said second time.

8. A sense amplifier according to claim 7 wherein said one of the control transistors conducts much less current than the other of the control transistors.

9. A sense amplifier according to claim 8 wherein the means for connecting the gates of the load transistor to the digit lines comprises a pair of MOS transistors, each of the MOS transistors having a gate, and means connecting a bias voltage less than said supply voltage to the gates of the MOS transistors.

10. A sense amplifier according to claim 9 wherein a capacitor means separately couples a clock source to said gates of the load transistors, the clock source producing a voltage no later than said second time in each operating cycle.

11. A sense amplifier according to claim 10 wherein means are provided for precharging the digit lines to a voltage level near the supply voltage, at a time prior to said first time in such operating cycle.

* * * * *